US007046724B2

(12) United States Patent
Nagasawa et al.

(10) Patent No.: US 7,046,724 B2
(45) Date of Patent: May 16, 2006

(54) EQUALIZER APPARATUS AND EQUALIZING METHOD

(75) Inventors: Hideyuki Nagasawa, Yokohama (JP); Hiroshi Irii, Tokyo (JP)

(73) Assignee: NTT DoCoMo, Inc., Tokyo (JP)

( * ) Notice: Subject to any disclaimer, the term of this patent is extended or adjusted under 35 U.S.C. 154(b) by 813 days.

(21) Appl. No.: 10/107,453

(22) Filed: Mar. 28, 2002

(65) Prior Publication Data

US 2002/0168000 A1 Nov. 14, 2002

(30) Foreign Application Priority Data

Mar. 28, 2001 (JP) ............................ 2001-094238

(51) Int. Cl.
*H03H 7/30* (2006.01)
*H03H 7/40* (2006.01)
*H03K 5/159* (2006.01)

(52) U.S. Cl. ...................................................... 375/229

(58) Field of Classification Search ................ 375/229, 375/346

See application file for complete search history.

(56) References Cited

U.S. PATENT DOCUMENTS 5,953,380 A * 9/1999 Ikeda ......................... 375/346
6,377,919 B1 * 4/2002 Burnett et al. .............. 704/231
6,526,378 B1 * 2/2003 Tasaki ........................ 704/224
2002/0191804 A1 * 12/2002 Luo et al. .................. 381/312

FOREIGN PATENT DOCUMENTS

EP 0 522 213 1/1993
JP 11-161294 6/1999
WO WO 00/62579 10/2000

OTHER PUBLICATIONS

Steven F. Boll, "Suppression of Acoustic Noise in Speech Using Spectral Subtration", IEEE transactions of Acoustics, Speech and signal processing, VOL ASSP-27, Apr. 1979.*

* cited by examiner

*Primary Examiner*—Chieh M. Fan
*Assistant Examiner*—Jia Lu
(74) *Attorney, Agent, or Firm*—Oblon, Spivak, McClelland, Maier & Neustadt, P.C.

(57) ABSTRACT

An equalizer apparatus comprises a sampled voice data extractor, a sampled noise data extractor and a sampled voice data characteristics corrector. The sampled voice data extractor extracts sampled voice data in a first time slot from the sampled voice data corresponding to a received voice signal. The sampled noise data extractor extracts sampled noise data in the first time slot and a second and third time slots before and after the first time slot from the sampled noise data corresponding to noise in a surrounding area of the apparatus. The sampled voice data characteristics corrector corrects characteristics of the sampled voice data in the first time slot extracted by the sampled voice data extractor based on characteristics of the sampled noise data in the first through third time slots extracted by the sampled noise data extractor.

7 Claims, 8 Drawing Sheets

"I"TH VOICE FREQUENCY SPECTRUM FRAME

EQUALIZER APPARATUS AND EQUALIZING METHOD

BACKGROUND OF THE INVENTION

1. Field of the Invention

The present invention relates to an equalizer apparatus that corrects characteristics of a received voice signal according to noise in a surrounding area of an apparatus.

2. Description of the Related Art

In a telephone call, voice (speech) of a calling party becomes inaudible due to noise in a surrounding area of a caller. In order to improve such a situation, technology has been proposed in which the voice of the calling party is made audible by measuring the noise in the surrounding area of the caller and correcting the characteristics of the voice of the calling party according to the noise. By such technology, a caller can easily follow the voice of the calling party by distinguishing the voice of the calling party from the noise even when the noise is loud.

However, in the above-mentioned conventional technology, when correcting the characteristics of the voice of the calling party in a period of time, the correction is performed according to the noise in the same period of time. For this reason, it is conceivable that when sudden noise is generated, the characteristics of the voice of the calling party change drastically according to the noise, thus the voice of the calling party becomes inaudible rather than becoming audible.

SUMMARY OF THE INVENTION

It is a general object of the present invention to provide a novel and useful equalizer apparatus, in which the problems described above are eliminated.

A more specific object of the present invention is to provide an equalizer apparatus maintaining audibility of a voice even when sudden noise is generated.

In order to achieve the above-mentioned objects, there is provided according to one aspect of the present invention, an equalizer apparatus comprising: a sampled voice data extractor that extracts sampled voice data in a first time slot from the sampled voice data corresponding to a received voice signal; a sampled noise data extractor that extracts sampled noise data in the first time slot and a second and third time slots before and after the first time slot from the sampled noise data corresponding to noise in a surrounding area of the apparatus; and a sampled voice data characteristics corrector that corrects characteristics of the sampled voice data in the first time slot extracted by the sampled voice data extractor based on characteristics of the sampled noise data in the first through third time slots extracted by the sampled noise data extractor.

Additionally, there is provided according to another aspect of the present invention, an equalizing method comprising: a sampled voice data extracting step that extracts sampled voice data in a first time slot from the sampled voice data corresponding to a received voice signal; a sampled noise data extracting step that extracts sampled noise data in the first time slot and a second and third time slots before and after the first time slot from the sampled noise data corresponding to noise in a surrounding area of the apparatus; and a sampled voice data characteristics correcting step that corrects characteristics of the sampled voice data in the first time slot extracted in the sampled voice data extracting step based on characteristics of the sampled noise data in the first through third time slots extracted in the sampled noise data extracting step.

According to the present invention, characteristics of the received voice are corrected taking into consideration the noise in time slots before and after a time slot including the received voice as well as the noise in the time slot including the received voice. For this reason, it is possible to maintain the audibility of the received voice since the characteristics of the received voice do not change drastically even when a sudden noise is generated.

Other objects, features and advantages of the present invention will become more apparent from the following detailed description when read in conjunction with the following drawings.

DETAILED DESCRIPTION OF THE PREFERRED EMBODIMENTS

Figure 1:
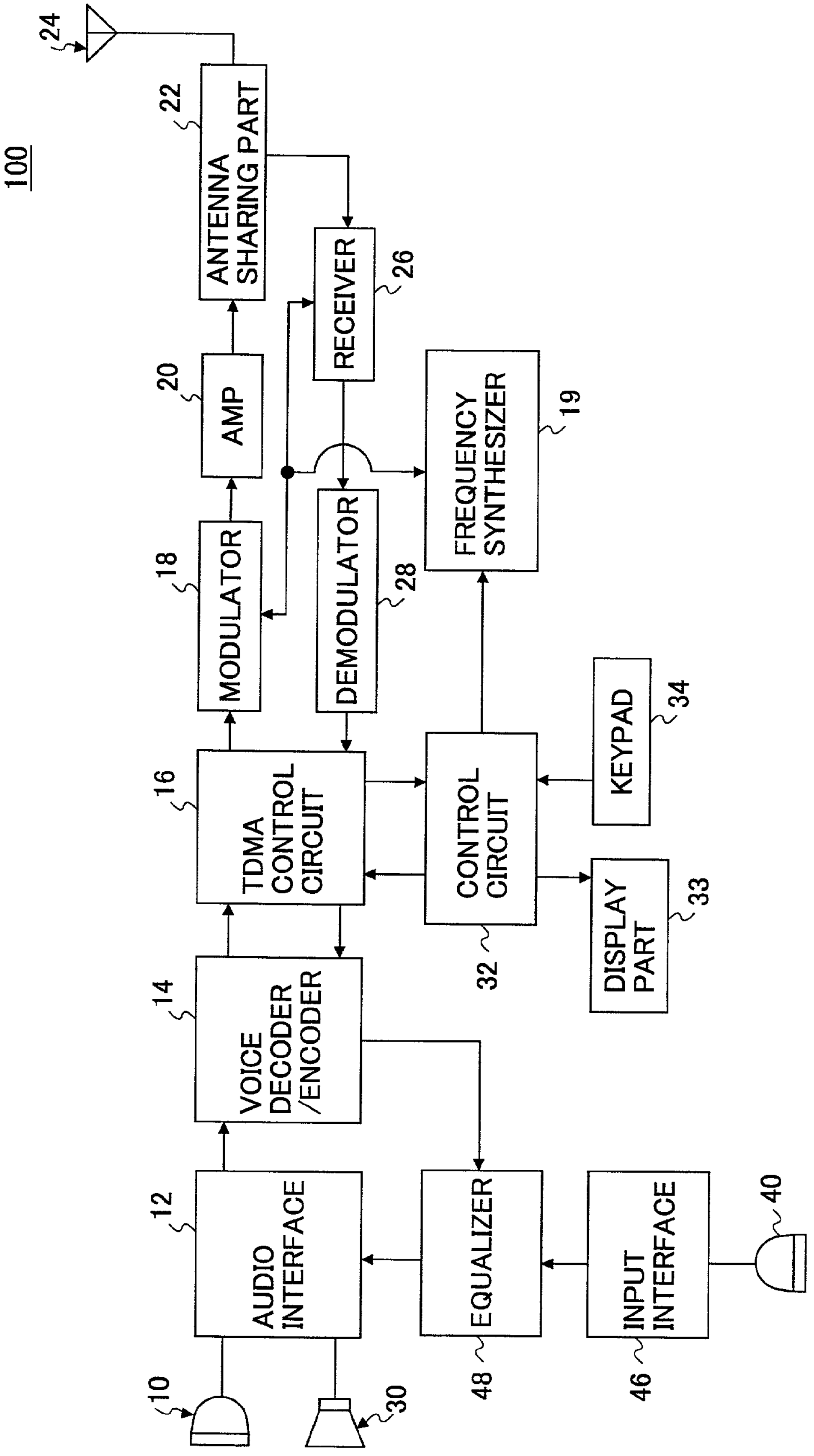
FIG. 1 is a block diagram showing an example of a structure of a mobile phone.

In the following, a description will be given of embodiments of the present invention based on drawings. FIG. 1 shows an example of a structure of a mobile phone to which an equalizer apparatus according to an embodiment of the present invention is applied. In this example, the mobile phone of a PDC (Personal Digital Cellular) system is shown.

A mobile phone 100 shown in FIG. 1 includes a microphone 10 for inputting voice of a user (caller), an audio interface 12 connected with a speaker 30 that outputs sound for announcing an incoming call, a voice encoder/decoder 14, a TDMA control circuit 16, a modulator 18, a frequency synthesizer 19, an amplifier (AMP) 20, an antenna sharing part 22, a transmitting/receiving antenna 24, a receiver 26, a demodulator 28, a control circuit 32, a display part 33, a keypad 34, a sound collecting microphone 40, an input interface 46, and an equalizer 48.

When receiving a call, the control circuit 32 receives an incoming signal from the mobile phone of a calling party through the transmitting/receiving antenna 24, the antenna sharing part 22, the receiver 26, the demodulator 28 and the TDMA control circuit 16. When the control circuit 32 receives the incoming signal, the control circuit 32 notifies the user of the incoming call by controlling the speaker 30 to output the sound for announcing the incoming call, controlling the display part 33 to display a predetermined screen or the like. Then, the call is started when the user performs a predetermined operation.

On the other hand, when making a call, the control circuit 32 generates an outgoing signal according to an operation of the user to the keypad 34. The outgoing signal is transmitted to the mobile phone of the calling party through the TDMA control circuit 16, the modulator 18, the amplifier 20, the antenna sharing part 22 and the transmitting/receiving antenna 24. Then, the call is started when the calling party performs a predetermined operation for receiving the call.

When the call is started, an analog voice signal output by the microphone 10 corresponding to input voice from the user is input to the voice encoder/decoder 14 through the audio interface 12 and is converted into a digital signal. The TDMA control circuit 16 generates a transmission frame according to TDMA (time-division multiple access) after performing a process of error correction or the like to the digital signal from the voice encoder/decoder 14. The modulator 18 forms a signal waveform of the transmission frame generated by the TDMA control circuit 16, and modulates a carrier wave from the frequency synthesizer 19 using the transmission frame after waveform shaping according to quadrature phase shift keying (QPSK). The modulated wave is amplified by the amplifier 20 and transmitted from the transmitting/receiving antenna 24 through the antenna sharing part 22.

On the other hand, the voice signal from the mobile phone of the calling party is received by the receiver 26 through the transmitting/receiving antenna 24 and the antenna sharing part 22. The receiver 26 converts the received incoming signal into an intermediate frequency signal using a local frequency signal generated by the frequency synthesizer 19. The demodulator 28 performs a demodulation process on an output signal from the receiver 26, corresponding to the modulation performed in a transmitter (not shown). The TDMA control circuit 16 performs processes of such as frame synchronization, multiple access separation, descrambling and error correction on a signal from the demodulator 28, and outputs the signal thereof to the voice encoder/decoder 14. The voice encoder/decoder 14 converts the output signal from the TDMA control circuit 16 into an analog voice signal. The analog signal is input to the equalizer 48.

The sound collecting microphone 40 detects sound (noise) in a surrounding area of the mobile phone 100, and provides an analog noise signal corresponding to the noise to the equalizer 48 through the input interface 46.

The equalizer 48 corrects characteristics of the voice signal from the voice encoder/decoder 14 so that the user can distinguish the voice of the calling party from the noise in the surrounding area and that the voice becomes audible.

Figure 2:
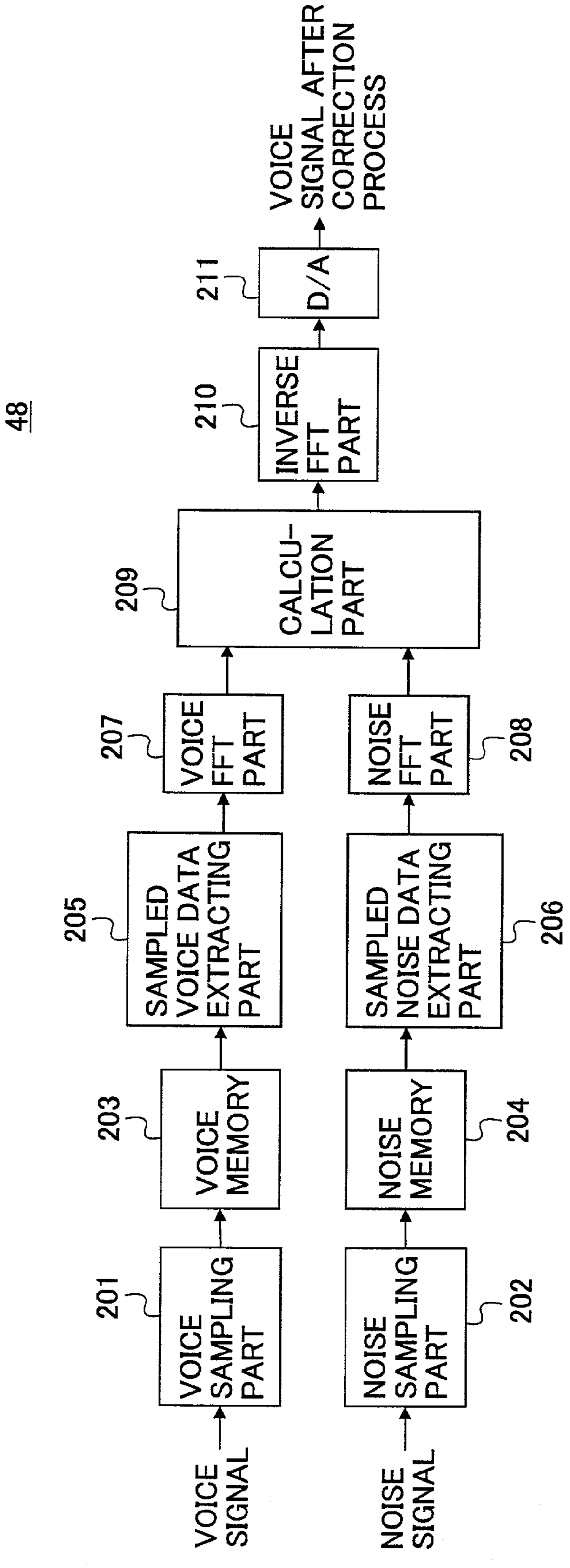
FIG. 2 is a block diagram showing an example of a structure of an equalizer apparatus.

FIG. 2 is a schematic diagram showing an example of a structure of the equalizer 48. The equalizer 48 includes a voice sampling part 201, a voice memory 203, a sampled voice data extracting part 205, and a voice fast Fourier transformation (FFT: Fast Fourier Transformation) part 207. Additionally, the equalizer 48 includes a noise sampling part 202, a noise memory 204, a sampled noise data extracting part 206, and a noise fast Fourier transformation (FFT) part 208. Further, the equalizer 48 includes a calculation part 209, an inverse fast Fourier transformation (FFT) part 210, and a digital/analog (D/A) converter 211.

Figure 3:
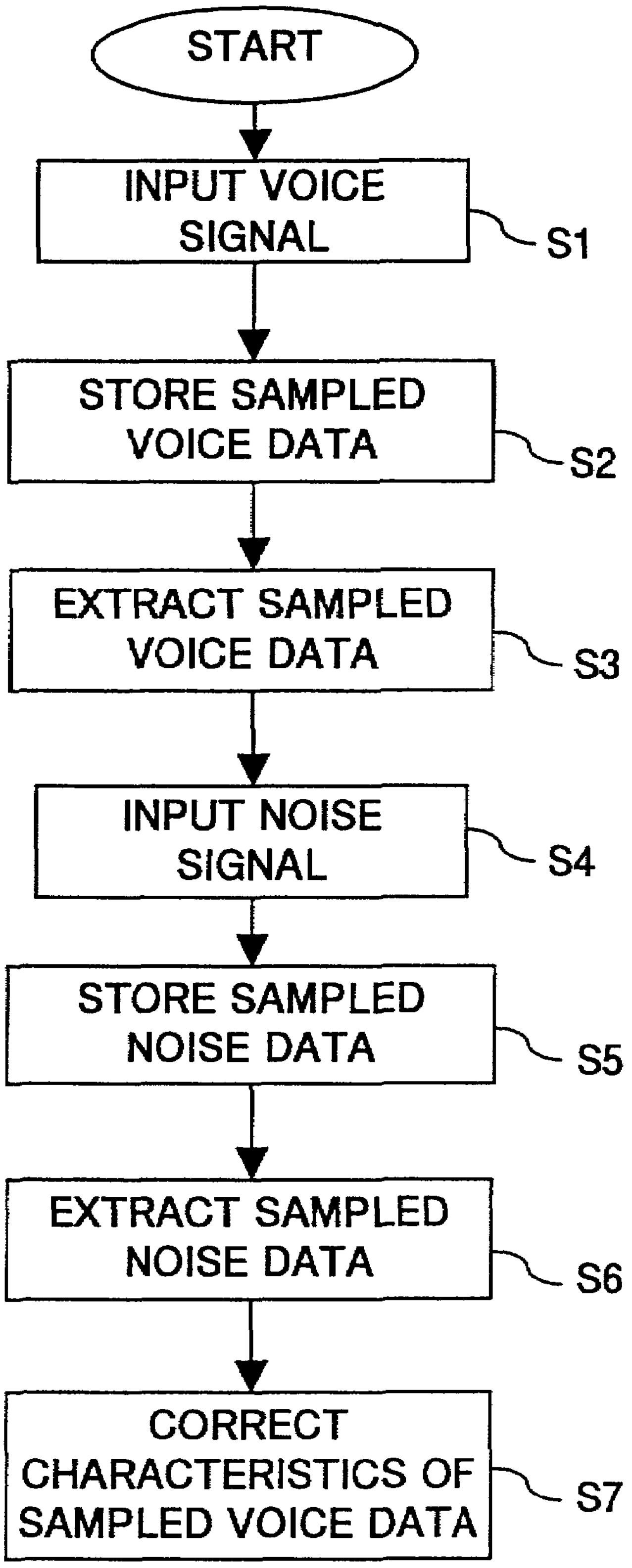
FIG. 3 is a flow chart for explaining an equalizing method according to the present invention.

Referring to FIG. 3, an equalizing method according to the present invention applied to the equalizer 48 will be described below. The voice encoder/decoder 14 inputs the voice signal to the voice sampling part 201 (S1). The voice sampling part 201 samples the voice signal at every predetermined time interval (125 μs, for example). The sampled data (referred to as "sampled voice data", hereinafter) is stored in the voice memory 203 (S2).

The sampled voice data extracting part 205 extracts the sampled voice data in a first time slot from the sampled voice data stored in the voice memory 203 (S3). The thus read sampled voice data in the first time slot forms a unit of correcting the characteristics of the voice. Next, the sampled voice data extracting part 205 generates a voice frame that is structured by the read sampled voice data in the first time slot.

Figure 4:
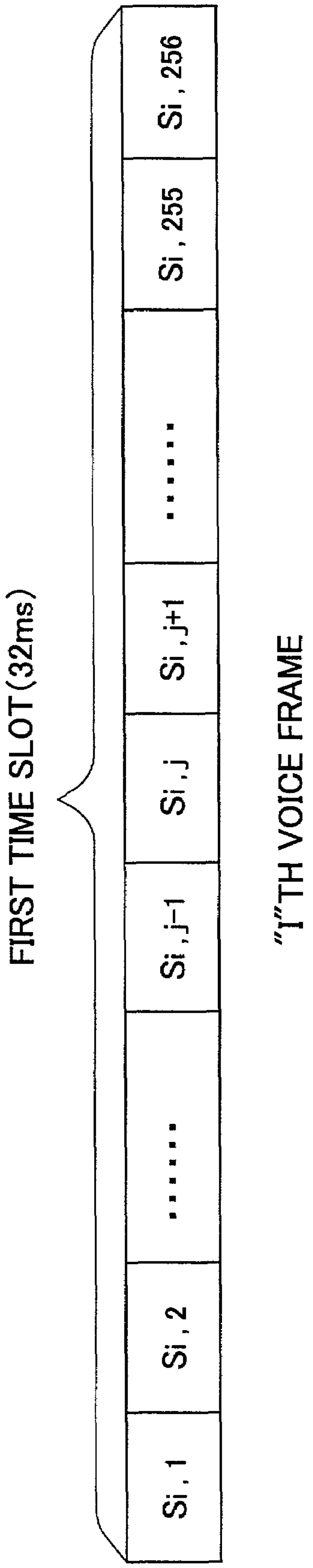
FIG. 4 is a schematic diagram showing an example of a voice frame.

FIG. 4 is a schematic diagram of an example of the voice frame. The voice frame shown in FIG. 4 is the example of a case where the voice signal is sampled at every 125 μs and the first time slot has a time length of 32 ms. In this case, the sampled voice data extracting part 205 extracts 256 sampled voice data $S_{i,j}$ in the first time slot from the voice memory 203, and structures the voice frame (the "i"th voice frame) corresponding to the first time slot. The sampled voice datum $S_{i,j}$ represents the sampled voice datum that is in the "i"th voice frame and is the "j"th ($1 \leqq j \leqq 256$) sampled voice datum in the "i"th voice frame thereof.

On the other hand, the noise signal is input from the sound collecting microphone 40 to the noise sampling part 202 through the input interface 46 (S4). The noise sampling part 202 samples the noise signal in the same cycle (every 125 μs, for example) as the sampling cycle of the above-mentioned voice signal. The sampled data (referred to as "sampled noise data", hereinafter) is stored in the noise memory 204 (S5).

The sampled noise data extracting part 206 extracts the above-mentioned sampled noise data in the first time slot, second time slot and third time slot from the sampled noise data stored in the noise memory 204 (S6). The thus extracted sampled noise data in the first through third time slots form a unit of correcting the characteristics of the sampled voice data in the first time slot. Next, the sampled noise data extracting part 206 generates a noise frame structured by the read sampled noise data in the first through third time slots.

Figure 5:
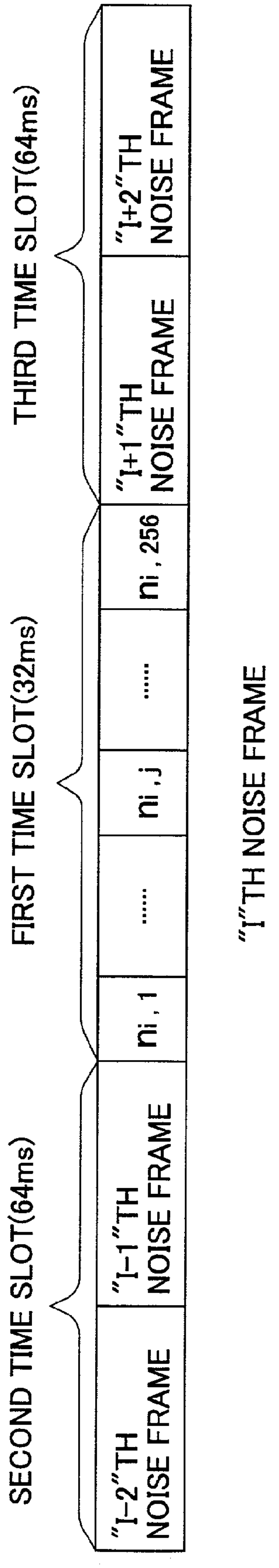
FIG. 5 is a schematic diagram showing an example of a noise frame.

FIG. 5 is a schematic diagram showing an example of the noise frame. FIG. 5 shows the noise frame in a case where the noise signal is sampled at every 125 μs, the first time slot has a time length of 32 ms, and each of the second and third time slots has a time length of 64 ms.

In this case, the sampled noise data extracting part 206 structures the noise frame (the "i"th noise frame) corresponding to the first time slot by reading 256 sampled noise data $n_{i,j}$ in the first time slot from the noise memory 204. The sampled noise datum $n_{i,j}$ represents the sampled noise datum that is in the "i"th noise frame and is the "j"th ($1 \leqq j \leqq 256$) sampled noise datum in the "i"th noise frame.

Similarly, the sampled noise data extracting part 206 extracts 512 sampled noise data $n_{i,j}$ in the second time slot from the noise memory 204, and structures the noise frame (the "i−2"th and "i−1"th noise frames) corresponding to the second time slot. Further, the sampled noise data extracting part 206 extracts 512 sampled noise data $n_{i,j}$ in the third time slot from the noise memory 204, and structures the noise frame (the "i+1"th and "i+2"th noise frames) corresponding to the third time slot. In this way, the noise frame including five noise frames (from the "i−2"th through the "i+2"th noise frames, with the "i"th noise frame as center, each noise frame having the time length of 32 ms) is structured.

The characteristics of the sampled voice data are corrected based on the above-mentioned characteristics of the sampled noise data included in the noise frames (S7).

Figure 6:
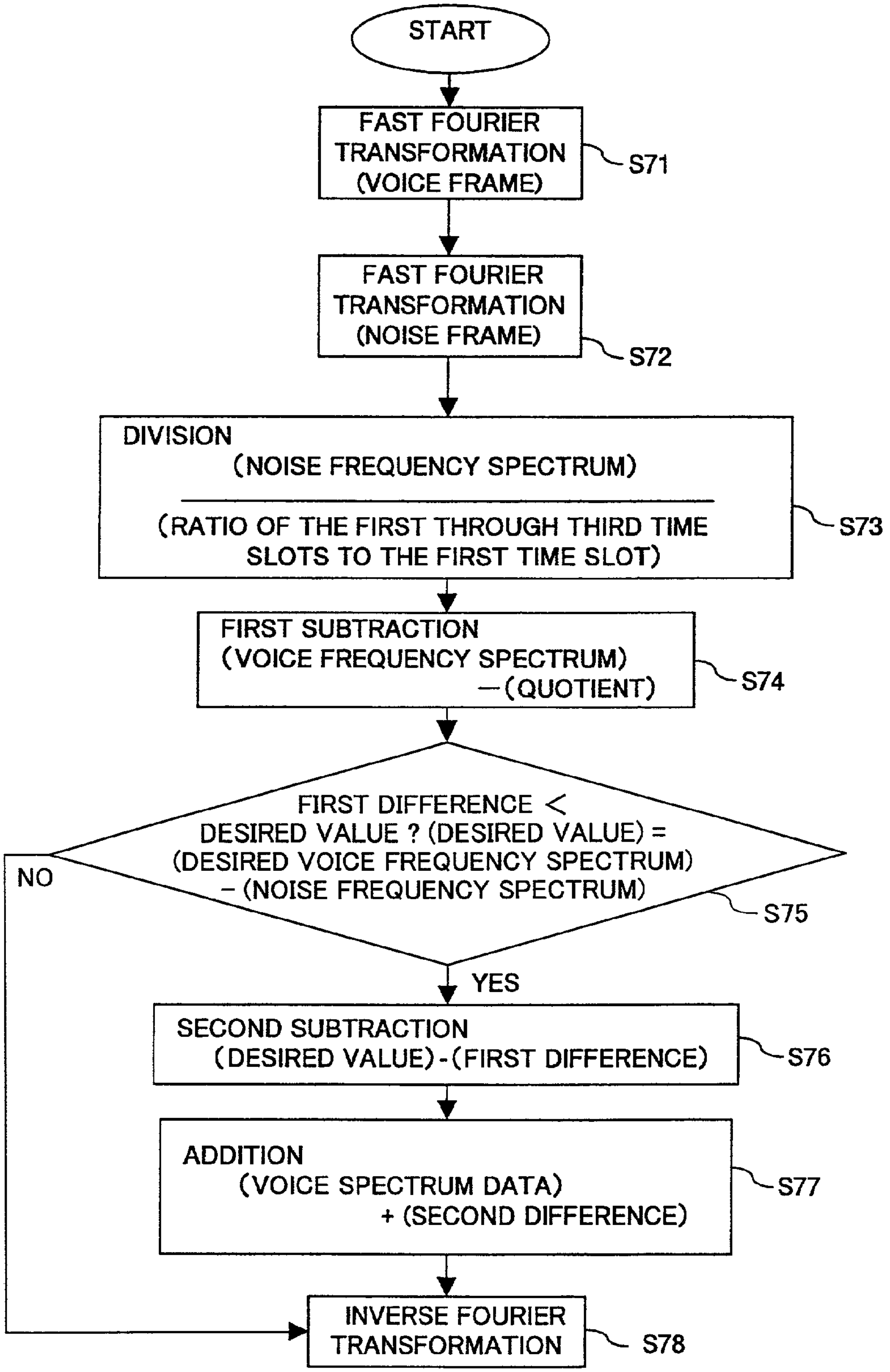
FIG. 6 is a flow chart for explaining a correction process of characteristics of sampled voice data.

Referring to FIG. 6, a correction process of the characteristics of the sampled voice data will be described below. The voice FFT part 207 performs fast Fourier transformation on the voice frame corresponding to the first time slot, and generates a voice frequency spectrum frame (S71).

Figure 7:
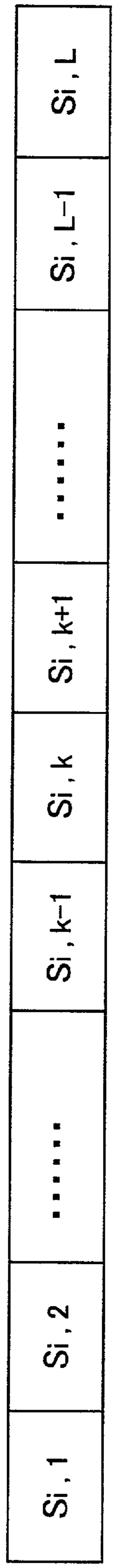
FIG. 7 is a schematic diagram showing an example of a voice frequency spectrum frame.

FIG. 7 is a schematic diagram showing an example of the voice frequency spectrum frame. The voice frequency spectrum frame in FIG. 7 is structured by L voice spectrum data $S_{i,k}$, each having a respective frequency band. The voice spectrum datum $S_{i,k}$ represents the voice spectrum datum that is in the "i"th voice frequency spectrum frame obtained by performing fast Fourier transformation on the "i"th voice frame, and is the "k"th ($1 \leqq k \leqq L$) voice spectrum datum when counted from the voice spectrum datum having the lowest frequency in the "i"th voice frequency spectrum frame.

Figure 8:
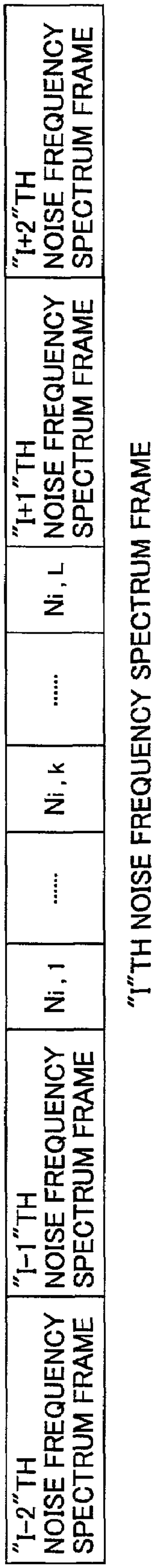
FIG. 8 is a schematic diagram showing an example of a noise frequency spectrum frame.

Additionally, the noise FFT part 208 performs fast Fourier transformation on the noise frame corresponding to the first through third time slots, and generates a noise frequency spectrum frame (S72). FIG. 8 is a schematic diagram showing an example of the noise frequency spectrum frame. FIG. 8 shows five noise frequency spectrum frames (from the "i−2"th through "i+2"th) obtained by performing fast Fourier transformation on the five noise frames (from the "i−2"th through "i+2"th) corresponding to the above-mentioned first through third time slots.

For example, the "i"th noise frequency spectrum frame obtained by performing fast Fourier transformation on the "i"th noise frame is structured by L noise spectrum data $N_{i,k}$, each having a respective frequency band. The noise spectrum datum $N_{i,k}$ represents the noise spectrum datum that is in the "i"th noise frequency spectrum frame obtained by performing fast Fourier transformation on the "i"th noise frame, and is the "k"th ($1 \leqq k \leqq L$) voice spectrum datum in the "i"th noise frequency spectrum frame when counted from the datum having the lowest frequency.

Similarly, the other noise frequency spectrum frames, that is, the "i−2"th, "i−1"th, "i+1"th and "i+2"th noise frequency spectrum frames obtained by performing fast Fourier transformation on the "i−2"th, "i−1"th, "i+1"th and "i+2"th noise frames, respectively, are structured by L noise spectrum data, each having a respective frequency band.

The calculation part 209 divides the "i"th voice frequency spectrum frame generated by the voice FFT part 207 into a plurality of voice spectrum data, each having one-third octave width.

Additionally, the calculation part 209 divides each of the "i−2"th through "i+2"th noise frequency spectrum frames generated by the noise FFT part 208 into a plurality of noise spectrum data, each having one-third octave width. Then, the calculation part 209 calculates each of average values ($\overline{N}$) of the noise spectrum data in one-third octave wide frequency bands. For example, when the "m"th frequency band having one-third octave width in the "i"th noise frame includes n noise spectrum data $N_{i,k}$ (from the "p"th through "p+n−1"th), the average value $\overline{N_{i,m}}$ is calculated by:

$$\overline{N_{i,m}} = \frac{1}{n}\sum_{k=p}^{p+n-1}\sqrt{(N_{i,k})^2}$$

Similarly, with regard to the other noise frequency spectrum frames (that is, the "i−2"th, "i−1"th, "i+1"th and "i+2"th noise frequency frames obtained by performing fast Fourier transformation on the "i−2"th, "i−1"th, "i+1"th and "i+2"th noise frames, respectively), each of the average values of the noise spectrum data in the above-mentioned frames, each data having one-third octave width, is calculated in the same manner.

In this way, the calculation part 209 divides each of the noise frequency spectrum frames (from the "i−2"th through "i+2"th) into the plurality of noise spectrum data, each having one-third octave width. Then, the calculation part 209 calculates the average value of each of the noise spectrum data having one-third octave width. In the next step, the calculation part 209 adds up the average values of the noise spectrum data, each average value based on data having one-third octave width and being positioned in the same relative place in each of the noise frequency frames. Further, the calculation part 209 divides the thus obtained sum of average values by a ratio of the first through third time slots to the first time slot, that is, five (S73). For example, a value $\overline{N_{i-2\sim i+2,m}}$ obtained by adding up the average values $\overline{N_{i-2,m}}$ through $\overline{N_{i+2,m}}$ of "m"th noise spectrum data in the noise spectrum frames and dividing the value thereof by five is calculated by:

$$\overline{N_{i-2\sim i+2,m}} = \frac{1}{5}(\overline{N_{i-2,m}} + \overline{N_{i-1,m}} + \overline{N_{i,m}} + \overline{N_{i+1,m}} + \overline{N_{i+2,m}})$$

Next, the calculation part 209 calculates a difference between each of a plurality of voice spectrum data in one-third octave wide frequency bands and the value obtained by the above division (S74). For example, the difference $\Delta_{i,m}$ between the voice spectrum data $S_{i,k}$ in one-third octave wide frequency bands and the above-mentioned quotient $\overline{N_{i-2\sim i+2,m}}$ is calculated by:

$$\Delta_{i,m} = S_{i,k} - \overline{N_{i-2\sim i+2,m}}$$

Next, the difference obtained by the above subtraction ($\Delta_{i,m}$) is compared with a difference between a desired voice frequency spectrum and the noise frequency spectrum (referred to as "desired value", hereinafter)(S75). When the difference is smaller than the desired value (YES in S75), the calculation part 209 adds a value obtained by subtracting the above-mentioned value ($\Delta_{i,m}$) from the desired value (S76) to the voice spectrum data (S77). The thus obtained voice spectrum data is output as new voice spectrum data (referred to as "voice spectrum data after correction process", hereinafter). For example, with respect to the voice spectrum data $S_{i,k}$ in one-third octave wide frequency band, when the difference $\Delta_{i,m}$ is smaller than the desired value R, the voice spectrum data $S_{i,k}$ is corrected so as to obtain the new voice spectrum data $S'_{i,k}$ by the following formula:

$$S'_{i,k} = S_{i,k} + (R - \Delta_{i,m})$$

Further, when the difference is equal to or larger than the desired value (NO in S75), the calculation part 209 does not correct the voice spectrum data and outputs the voice spectrum data as is as the voice spectrum data after the correction process.

The inverse FFT part 210 performs inverse fast Fourier transformation on the voice frequency spectrum frame structured by the voice spectrum data after the correction process, and generates a voice frame after the correction process corresponding to the first time slot (S78). The voice frame after the correction process is converted into an analog signal by the D/A converter 211, and is output from the speaker 30 through the audio interface 12 showed in FIG. 1.

Accordingly, the equalizer 48 in the mobile phone 100 corrects the characteristics of the sampled voice data in the first time slot corresponding to the received voice signal based on the characteristics of the sampled noise data in the first time slot and the second and third time slots before and after the first time slot, the sampled noise data corresponding to the noise in the surrounding area of the mobile phone. In other words, the characteristics of the received voice are corrected in consideration of the noise in time slots before and after the time slot including the received voice as well as the time slot including the received voice. For this reason, it is possible to maintain the audibility of the received voice signal since the characteristics of the voice do not change drastically even when the sudden noise is generated.

Further, in the above-described embodiments, the sampling cycles of the voice signal and the noise signal are set to 125 μs. However, the sampling cycle is not limited to 125 μs. Additionally, the first time slot has the time length of 32 ms, and the second and third time slots have the time length of 64 ms, which are twice as long as the first time slot. However, these time lengths are not limited to the values mentioned above, either.

The present invention is not limited to the specifically disclosed embodiments, and variations and modifications may be made without departing from the scope of the present invention.

The present application is based on a Japanese priority application No. 2001-094238 filed on Mar. 28, 2001, the entire contents of which are hereby incorporated by reference.

What is claimed is:

1. An equalizer apparatus, comprising:

a sampled voice data extractor configured to extract sampled voice data in a first time slot from the sampled voice data corresponding to a received voice signal;

a sampled noise data extractor configured to extract sampled noise data in the first time slot and a second and third time slots before and after the first time slot from the sampled noise data corresponding to noise in a surrounding area of the apparatus;

a sampled voice data characteristics corrector configured to correct characteristics of the sampled voice data in the first time slot extracted by the sampled voice data extractor based on characteristics of the sampled noise data in the first through third time slots extracted by the sampled noise data extractor; and the sampled voice data characteristics corrector comprising a first fast Fourier transformation part configured to perform fast Fourier transformation on the sampled voice data in the first time slot so as to generate a voice frequency spectrum and a second fast Fourier transformation part configured to perform fast Fourier transformation on the sampled noise data in the first through third time slots so as to generate a noise frequency spectrum;

a divider configured to calculate a value by dividing the noise frequency spectrum generated by the second fast Fourier transformation part by a ratio of the first through third time slots to the first time slot.

2. The equalizer apparatus as claimed in claim 1, wherein the sampled voice data characteristics corrector further comprises:

a first subtractor configured to calculate a value by subtracting the value calculated by the divider from the voice frequency spectrum generated by the first fast Fourier transformation part;

a second subtractor configured to calculate a value by subtracting the value calculated by the first subtractor from a difference between a desired voice frequency spectrum and the noise frequency spectrum;

an adder configured to calculate a value by adding the voice frequency spectrum generated by the first fast Fourier transformation part and the value calculated by the second subtractor; and an inverse fast Fourier transformation part configured to perform inverse fast Fourier transformation on the value calculated by the adder.

3. The equalizer apparatus as claimed in claim 2, wherein:

the divider is further configured to divide the noise frequency spectrum in a predetermined frequency band by the radio of the first through third time slots to the first time slot;

the first subtractor is further configured to subtract a value calculated by the divider from the voice frequency spectrum in the predetermined frequency band;

the second subtractor is further configured to subtract a value calculated by the first subtractor from a difference between a desired voice frequency spectrum in the predetermined frequency band and the noise frequency spectrum; and the adder is further configured to add the voice frequency spectrum in the predetermined frequency band and the value calculated by the second subtractor.

4. A mobile station, comprising the equalizer apparatus as claimed in claim 1.

5. An equalizing method, comprising:

a sampled voice data extracting step that extracts sampled voice data in a first time slot from the sampled voice data corresponding to a received voice signal;

a sampled noise data extracting step that extracts sampled noise data in the first time slot and a second and a third time slots before and after the first time slot from the sampled noise data corresponding to noise in a surrounding area;

a sampled voice data characteristics correcting step including a first fast Fourier transformation step that performs fast Fourier transformation on the sampled voice data in the first time slot so as to generate a voice frequency spectrum, a second fast Fourier transformation step that performs fast Fourier transformation on the sampled noise data in the first through third time slots so as to generate a noise frequency spectrum, and a correcting step that corrects characteristics of the sampled voice data in the first time slot extracted in the sampled voice data extracting step based on characteristic of the sampled noise data in the first through third time slots extracted in the sampled noise data extracting step;

a dividing step that calculates a value by dividing the noise frequency spectrum generated by the second fast Fourier transformation step by a ratio of the first through third time slots to the first time slot.

6. The equalizing method as claimed in claim 5, wherein the sampled voice data characteristics correcting step comprises:

a first subtraction step that calculates a value by subtracting the value calculated in the dividing step from the voice frequency spectrum generated by the first fast Fourier transformation step;

a second subtraction step that calculates a value by subtracting the value calculated in the first subtraction step from a difference between a desired voice frequency spectrum and the noise frequency spectrum;

an addition step that calculates a value by adding the voice frequency spectrum generated in the first fast Fourier transformation step and the value calculated in the second subtraction step; and an inverse fast Fourier transformation step that performs inverse fast Fourier transformation on the value calculated in the addition step.

7. The equalizing method as claimed in claim 6, wherein:

the dividing step comprises a step of dividing the noise frequency spectrum in a predetermined frequency band by the ratio of the first through third time slots to the first time slot;

the first subtraction step comprises a step of subtracting a value calculated in the dividing step from the voice frequency spectrum in the predetermined frequency band;

the second subtraction step comprises a step of subtracting a value calculated in the first subtraction step from the difference between the desired voice frequency spectrum in the predetermined frequency band and the noise frequency spectrum; and the addition step comprises a step of adding the voice frequency spectrum in the predetermined frequency band and a value calculated in the second subtraction step.

* * * * *